Figure 1:
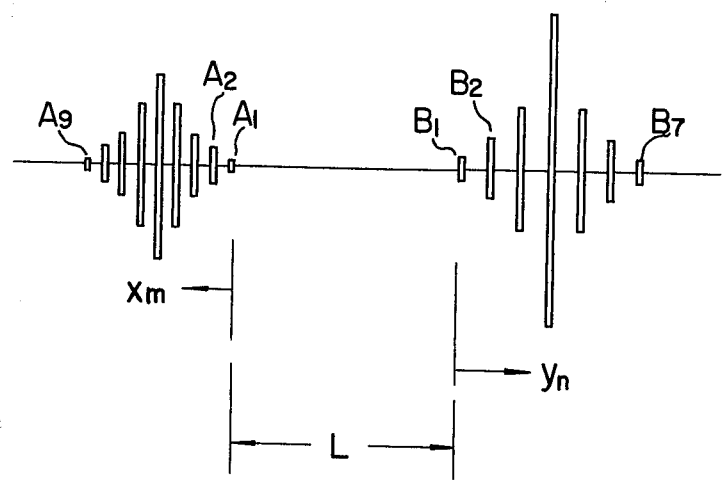

United States Patent [19]
Yamada

[11] Patent Number: 4,472,653
[45] Date of Patent: Sep. 18, 1984

[54] ELECTRODE PATTERN FOR SURFACE ACOUSTIC WAVE DEVICE

[75] Inventor: Jun Yamada, Yokohama, Japan
[73] Assignee: Hitachi, Ltd., Tokyo, Japan
[21] Appl. No.: 510,913
[22] Filed: Jul. 5, 1983
[30] Foreign Application Priority Data Jul. 5, 1982 [JP] Japan .............................. 57-115395

[51] Int. Cl.³ .......................................... H01L 41/08
[52] U.S. Cl. ............................................ 310/313 C
[58] Field of Search ........... 310/313 B, 313 C, 313 R; 333/150, 154, 193, 196

[56] References Cited
U.S. PATENT DOCUMENTS 3,768,032 10/1973 Mitchell ...................... 310/313 C

*Primary Examiner*—Mark O. Budd
*Attorney, Agent, or Firm*—Antonelli, Terry & Wands

[57] ABSTRACT

A surface acoustic wave device comprises on a piezoelectric substrate a first interdigital electrode array for converting electric signals into surface acoustic waves and a second interdigital electrode array for receiving the surface acoustic waves propagating from the first interdigital electrode array along the surface portion of the piezoelectric substrate to convert them into electric signals again. The lengths of overlapping of the pairs of adjacent interdigital electrode or finger portions in each of the first and second electrode arrays are not the same. The distribution of the overlapping finger lengths in one of the first and second electrode arrays along the direction of propagation of the surface acoustic waves or the transverse direction of the piezoelectric substrate is such that the overlapping finger length has the minimum value at a central portion of the one electrode array and gradually increases toward both sides of the one electrode array.

6 Claims, 2 Drawing Figures

ELECTRODE PATTERN FOR SURFACE ACOUSTIC WAVE DEVICE

The present invention relates to surface acoustic wave devices.

With demands for the launching of a broadcasting satellite for practical use, it is required to develop a high-performance, low-cost SHF receiver. For the required receiver, it is necessary that the receiver is provided with a bandpass filter for the second IF (intermediate frequency) band which filter has amplitude characteristics with a sidelobe attenuation of 60 dB. Such nearly ideal characteristics have hitherto been demanded not only in the SHF receiver but also in a general communication apparatus. The realization of such characteristics by a surface acoustic wave filter requires that electrodes in each of input and output transducers are weighted. In this case, a multistrip coupler as disclosed in U.S. Pat. No. 3,836,876 is used in order that the whole frequency characteristic of the filter can be simply determined by the product of the frequency characteristic of the input transducer and that of the output transducer, without considering all the combinations of any electrode in the input and output transducers which combination has as variables the magnitude of weighting and the electrode pair position. The use of the multi-strip coupler makes it easy to design the filter, but is disadvantageous in that the filter becomes very large in size.

It is therefore an object of the present invention to provide a surface acoustic wave device which can be easily designed without requiring increased dimensions.

In a surface acoustic wave device comprising input and output transducers each having weighted electrodes, according to the present invention, the minimum one of the lengths of overlapping of the pairs of adjacent interdigital electrode or finger portions in one of the input and output transducers is selected to be not smaller than the maximum one of the lengths of overlapping of the pairs of adjacent interdigital electrode portions in the other transducer, in order that the filtering frequency characteristic of the device is determined by the product of the frequency characteristics of the input and output transducers.

Figure 2:
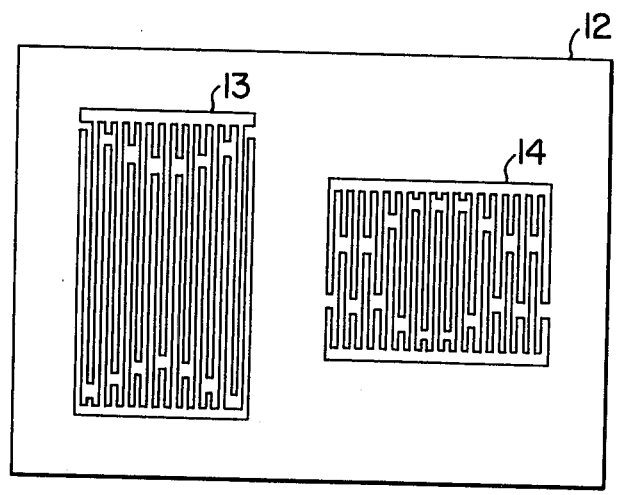

The present invention now be described in detail referring to the accompanying drawing, in which:

FIG. 1 is a schematic view showing the position and dimension of each of wave sources included in a surface acoustic wave device; and FIG. 2 is a plan view showing a surface acoustic wave device according to an embodiment of the present invention.

The principle of the present invention will be explained with reference to FIG. 1.

Referring to FIG. 1, wave sources in a surface acoustic wave device, that is, those surface portions of a piezoelectric substrate between electrodes of opposite polarities are indicated as linear sound sources $A_1$ to $A_9$ and $B_1$ to $B_7$. The linear sound sources $A_1$ to $A_9$ correspond to the wave sources included in an input transducer, while the linear sound sources $B_1$ to $B_7$ correspond to the wave sources included in an output transducer. The longitudinal center axis of each linear sound source coincides with that of each wave source, and the length of each linear sound source in a longitudinal direction corresponds to the magnitude of each wave source.

Assuming that the lengths of the linear sound sources $A_1$ to $A_9$ and $B_1$ to $B_7$ are expressed by $a_1$ to $a_9$ and $b_1$ to $b_7$, the positions of the sound sources $A_1$ to $A_9$ in a transverse direction are expressed by $x_1$ to $x_9$ each indicating a distance from the sound source $A_1$ (that is, $x_1=0$), the position of the sound sources $B_1$ to $B_7$ in the transverse direction is expressed by $y_1$ to $y_7$ each indicating a distance from the sound source $B_1$ (that is, $y_1=0$), and a distance between the sound sources $A_1$ and $B_1$ is expressed by $L$, then, a voltage $\phi_{n,m}$ taken out from any one $B_n$ ($n=1, 2, \ldots, 7$) of the linear sound sources $B_1$ to $B_7$ which receives a surface acoustic wave emitted from any one $A_m$ ($m=1, 2, \ldots, 9$) of the linear sound sources $A_1$ to $A_9$, is given as follows:

$$\phi_{n,m} \propto \frac{a_m}{b_n} e^{i\{\omega t - k(L + x_m + y_n)\}}$$

If surface acoustic waves emitted from any wave source included in the input transducer are received completely by all of electrode pairs included in the output transducer, that is, if the maximum value $a_{max}$ of $a_m$ is not greater than the minimum value $b_{min}$ of $b_n$ ($a_{max} \leq b_{min}$), the frequency characteristic $H(\omega)$ of the resultant composite voltage taken out from the output transducer is given as follows:

$$H(\omega) = \sum_{m=1}^{9} \sum_{n=1}^{7} \phi_{n,m}$$

$$= e^{i(\omega t - kL)} \left( \sum_{m=1}^{9} a_m e^{-ikx_m} \right) \left( \sum_{n=1}^{7} \frac{1}{b_n} e^{-iky_n} \right)$$

Accordingly, by making the length of overlapping of any paired interdigital electrodes or finger portions in the output transducer not smaller than that in the input transducer, the frequency characteristic of the surface acoustic wave device can be expressed by the product of the transfer characteristic of the input transducer and that of the output transducer without using a multi-strip coupler. In this case, however, it should be noted that in the transfer characteristic of the output transducer is used the reciprocal of the overlapping electrode or finger length. Further, it is needless to say that the input and output transducers can be used as output and input transducers, respectively, as is made in the conventional surface acoustic wave device. Since the frequency characteristics of the input and output transducers of the surface acoustic wave device have no change even if the input and output transducers are used as output and input transducers, respectively, the above conclusion means that if the distribution of overlapping electrode length in one of the input and output transducers is represented by means of the reciprocal of the overlapping length and the minimum one of the overlapping lengths in the one transducer is defined to be not smaller than the maximum one of the overlapping lengths in the other transducer, the composite frequency characteristic of the device can be represented by the product of the frequency characteristics of the two transducers while allowing the weighting of each transducer without using a multi-strip coupler.

FIG. 2 shows an embodiment of a band-pass filter transmitting the second IF (intermediate frequency) band will be explained which is based on the above-mentioned principle and is suitable for use in SHF receivers. In the present embodiment, 128° rotated Y axis cut monocrystalline lithium niobate is used as a piezoelectric substrate. It is assumed that surface acoustic waves are propagated in the direction of X axis. Referring to FIG. 2, reference numeral 12 designates the piezoelectric substrate, 13 an input transducer, and 14 an output transducer. The input transducer 13 is formed of a set of first and second weighted interdigitated electrodes, e.g., a pair of metal electrodes of comb-shaped form with interleaved teeth. As shown in FIG. 2, the length of overlapping of the paired interdigital electrodes, that is, the overlapping length of the tooth or finger portions of the first and second electrodes is smallest at a central portion of the input transducer 13 and gradually increases as the overlapping electrodes, that is, the overlapping length of the tooth portions are nearer to both ends of the input transducer. The output transducer 14 is formed of a set of third and fourth interdigitated electrodes, e.g., a pair of metal electrodes of a comb-shaped form with interleaved teeth, which are weighted in a well known manner so that the length of overlapping of the paired interdigital electrode or finger portions of the third and fourth electrodes is largest at a central portion of the output transducer 14 and gradually decreases as the overlapping electrode portions are nearer to both ends of the output transducer. It is essential that the minimum one of the overlapping finger lengths in the input transducer 13 is not smaller than the maximum one of the overlapping finger lengths in the output transducer 14. The finger portion in each of the input and output transducers has a double electrode structure.

An example of dimensions of the device made by the present inventors is as follows:

input transducer
  number of interdigital finger pairs: 5.5
  overlapping finger length:
    1000 μm at central portion
    1800 μm at end portions
output transducer
  number of interdigital finger pairs: 30
  overlapping finger length:
    1000 μm at central portion The width of the finger portion of each transducer was 3.7 μm. All the electrodes were formed of an evaporated aluminum film with a thickness of 5000 Å through photolithographic techniques.

As is apparent from the foregoing, according to the present invention, a surface acoustic wave filter of practical size and shape (in other words, of low cost) capable of greatly suppressing sidelobes and suitable for use in SHF receivers or communication apparatuses can be formed without using a multi-strip coupler.

The second-IF filter for the SHF receiver according to the above-mentioned embodiment has a chip size of 4 mm×2.5 mm which is about 20% smaller in a transverse direction and about 50% smaller in a longitudinal direction than a conventional chip based upon the prior art design.

I claim:

1. A surface acoustic wave device comprising a piezoelectric substrate, an input transducer provided on said piezoelectric substrate for converting electric signals applied thereto into acoustic surface waves, said input transducer including a set of first and second interdigitated electrodes in which the lengths of overlapping of the pairs of adjacent interdigital finger portions in said first and second interdigitated electrodes are not the same, and an output transducer provided on said piezoelectric substrate spaced from said input transducer for receiving said acoustic surface waves to convert the same into electric signals again, said output transducer including a set of third and fourth interdigitated electrodes in which the lengths of overlapping of the pairs of adjacent interdigital finger portions in said third and fourth interdigitated electrodes are not the same, the minimum one of the overlapping finger lengths in one of said input and output transducers being defined to be not smaller than the maximum one of the overlapping finger lengths in the other transducer.

2. A surface acoustic wave device according to claim 1, wherein the finger pair providing the minimum overlapping finger length in said one transducer is positioned at a central portion of said one transducer.

3. A surface acoustic wave device according to claim 1, wherein said set of first and second interdigitated electrodes comprises one pair of opposing comb-shaped metal electrodes with interleaved teeth, the pairs of adjacent interdigital finger portions being formed by pairs of adjacent interleaved teeth of the respective comb-shaped electrodes, and said set of third and fourth interdigitated electrodes comprises another pair of comb-shaped opposing metal electrodes with interleaved teeth, the pairs of adjacent interdigital finger portions being formed by pairs of adjacent interleaved teeth of the respective comb-shaped electrodes.

4. A surface acoustic wave device according to claim 3, wherein the finger pair providing the minimum overlapping finger length in said one transducer comprises a pair of adjacent interleaved teeth positioned at a central porton of said one transducer.

5. A surface acoustic wave device comprising:
  a piezoelectric substrate;
  an input transducer provided on said piezoelectric substrate and including a pair of opposing comb-shaped metal electrodes with interleaved teeth, said input transducer converting electric signals applied thereto into acoustic surface waves; and
  an output transducer provided on said piezoelectric substrate spaced from said input transducer and including a pair of opposed comb-spaced metal electrodes with interleaved teeth, said output transducer receiving said acoustic surface waves to convert the same into electric signals again,
  each of said pairs of opposing metal electrodes having overlapping tooth portions of dissimilar length, and the minimum length of overlapping tooth portions in one of said pairs being not smaller than the maximum length of overlapping tooth portions in the other of said pairs.

6. A surface acoustic wave device according to claim 5, wherein the overlapping tooth portions providing the minimum length of said one of said pairs is positioned at a central portion of said one of said pairs of opposing comb-shaped metal electrodes.

* * * * *